(12) United States Patent
Jeon

(10) Patent No.: US 7,663,402 B2
(45) Date of Patent: Feb. 16, 2010

(54) HIGH VOLTAGE STRESS TEST CIRCUIT

(75) Inventor: Yong Weon Jeon, Seongnam-si (KR)

(73) Assignee: TLI Inc., Seongnam-si (KR)

( * ) Notice: Subject to any disclaimer, the term of this patent is extended or adjusted under 35 U.S.C. 154(b) by 0 days.

(21) Appl. No.: 12/352,812

(22) Filed: Jan. 13, 2009

(65) Prior Publication Data

US 2009/0195266 A1    Aug. 6, 2009

(30) Foreign Application Priority Data

Jan. 14, 2008    (KR) ...................... 10-2008-0003774

(51) Int. Cl.
    *H03K 19/094*    (2006.01)
(52) U.S. Cl. .......................................... 326/68; 326/81
(58) Field of Classification Search .................. 326/16, 326/68–71, 80–87
    See application file for complete search history.

(56) References Cited

U.S. PATENT DOCUMENTS 7,161,387 B2 *  1/2007  Yamasaki et al. ............. 326/81

2005/0280461 A1 * 12/2005 Teraishi ...................... 327/333
2007/0085591 A1 *  4/2007 Teraishi ...................... 327/333

FOREIGN PATENT DOCUMENTS

| KR | 10-2006-0118414 | 11/2006 |
| KR | 10-2006-0123780 | 12/2006 |
| KR | 10-2007-0019882 | 2/2007 |
| KR | 10-2007-0056798 | 6/2007 |

* cited by examiner

*Primary Examiner*—Don P Le
(74) *Attorney, Agent, or Firm*—Jae Y. Park; Kile Goekjian Reed & McManus PLLC

(57) ABSTRACT

A high voltage stress test circuit includes an internal data generation unit for generating internal data and inverted internal data, and a level shifter for receiving the internal data and the inverted internal data and for generating digital data and inverted digital data. In a normal mode, the internal data and the inverted internal data have logic states corresponding to input data, while the digital data and the inverted digital data have logic states corresponding to the internal data and the inverted internal data. In a high voltage stress test mode, the internal data and the inverted internal data have predetermined logic states regardless of a logic state of the input data, while the digital data and the inverted digital data have predetermined logic states regardless of logic states of the internal data and the inverted internal data.

12 Claims, 11 Drawing Sheets

HIGH VOLTAGE STRESS TEST CIRCUIT

This application claims priority to Korean Patent Application No. 10-2008-0003774, filed on Jan. 14, 2008, and all the benefits accruing therefrom under 35 U.S.C. § 119, the contents of which in its entirety are herein incorporated by reference.

BACKGROUND OF THE INVENTION

1. Field of the Invention

The present invention relates to a High Voltage Stress ("HVS") test circuit for semiconductor devices and, more particularly, to an HVS test circuit for decoders, the HVS test circuit having a substantially reduced number of high supply voltage transistors.

2. Description of the Related Art

Typically, a test is performed during manufacture of a semiconductor device. Specifically, the test operates a semiconductor element of a manufactured semiconductor device to quickly test electrical characteristics and functional characteristics thereof, as well as to distinguish acceptable products from unacceptable products. Furthermore, the electrical and/or functional characteristics and yield of products, such as the semiconductor device, can be substantially improved by collecting and analyzing test data from the test and applying the test data to modify a manufacturing process of the products.

For example, in an HVS test, for example, one or more defects (or potential defects) can be discovered by applying stress to two ends of an insulating film of an MOS transistor of the semiconductor device. Specifically, in the HVS test, a high voltage is forcibly applied to the two ends of the insulating film. As a result, defects are discovered and a reliability of products is substantially improved by preemptively eliminating potential defects, for example.

FIG. 1 is a schematic diagram of a 1-bit n-channel metal oxide semiconductor ("NMOS") of the prior art. Semiconductor devices typically include various types of decoders, such as the 1-bit NMOS decoder shown in FIG. 1, for example. In operation in a normal mode, the 1-bit NMOS decoder shown in FIG. 1 generates one of two input voltage levels V11 and V12 as a voltage level of an output signal DOUT1, based on a logic state of digital data DH applied to the transistor 12. As shown in FIG. 1, an inverted digital signal DHB, which is an inverted digital data of the digital data DH, is applied to the transistor 11.

To conduct an HVS test of the transistors 11 and 12 of the decoder, within a short period of time, the digital data DH and the inverted digital data DHB must be applied at a high supply voltage HVDD when the two input voltage levels V11 and V12 are maintained at a ground voltage VSS.

In addition, to conduct the HVS test, an HVS test circuit is contained in a semiconductor device. Specifically, in normal mode, the digital data DH and the inverted digital data DHB are provided by the HVS test circuit to have opposite logic states (based on a logic state of input data), while the digital data DH and the inverted digital data DHB are supplied at a high supply voltage HVDD (regardless of a logic state of the input data) in an HVS test mode.

FIG. 2 is a schematic diagram of an HVS test circuit according to the prior art. As shown in FIG. 2, the HVS test circuit of the prior art includes an internal data generation unit 110 for generating both internal data IDI and inverted internal data IDIB based on input data DI, and a level shifter 130 for generating both output data ODI and inverted output data ODIB by level-shifting the internal data IDI and the inverted internal data IDIB to the high supply voltage HVDD. Thus, the low supply voltage LVDD is used in the internal data generation unit 110, while the high supply voltage HVDD is used in the level shifter 130.

Meanwhile, the level shifter 130 is typically implemented using six transistors 131-136 using the high supply voltage HVDD, as shown in FIG. 3, which is a schematic diagram of a level shifter according to the prior art. Specifically, a p-channel metal oxide semiconductor ("PMOS") transistor 131 and a PMOS transistor 132 pull up the output data ODI and the inverted output data ODIB to the high supply voltage HVDD in response to a pulling down of the inverted output data ODIB and the output data ODI. In addition PMOS transistors 133 and 134 function as resistances to reduce a short-circuit current which may be generated during switching of the output data ODI and the inverted output data ODIB. Additionally, an NMOS transistor 135 and an NMOS transistor 136 pull down the output data ODI and the inverted output data ODIB to a ground voltage VSS in response to the pulling up of the inverted output data ODIB and the output data ODI.

Referring again to FIG. 2, the HVS test circuit further includes a test response unit 150 for generating digital data DH and inverted digital data DHB based on the output data ODI and the inverted output data ODIB. The test response unit 150 typically includes two logical sum gates 151 and 152. In HVS test mode, in which a test mode signal VTEST is activated to a high logic state, the two logical sum gates 151 and 152 control the digital data DH and the inverted digital data DHB so that they have the high logic state regardless of logic states of the output data ODI and the inverted output data ODIB. Further, each of the two logical sum gates 151 and 152 is generally implemented using six transistors 21-26, as shown in FIG. 4, which is a schematic diagram of a logical sum gate according to the prior art. The test response unit 150 uses the high supply voltage HVDD and receives first and second inputs IN1 and IN2, respectively, corresponding to the output data ODI and the inverted output data ODIB, respectively (FIG. 2), for example, and outputs an output signal OUT, corresponding to the digital data DH or the inverted digital data DHB (FIG. 2), for example, as shown in FIG. 4.

However, a MOS transistor using the high supply voltage HVDD requires a considerably large layout area, as compared to a MOS transistor using the low supply voltage LVDD, due to leakage current being equal to or less than a threshold voltage of the associated MOS transistor. As a result, a reduction of a number of MOS transistors which use the high supply voltage HVDD is required, to substantially reduce a layout area, e.g., a size, of a semiconductor device according to an exemplary embodiment of the present invention.

BRIEF SUMMARY OF THE INVENTION

Accordingly, to solve the abovementioned problems in the prior art, exemplary embodiments of the present invention provide an HVS test circuit for semiconductor devices, and, more particularly, an HVS test circuit having a substantially reduced and/or effectively minimized layout area thereof. Therefore, the HVS test circuit according to an exemplary embodiment of the present invention has a substantially reduced number of transistors which use a high supply voltage.

In an exemplary embodiment of the present invention, a high voltage stress ("HVS") test circuit includes an internal data generation unit for generating internal data and inverted internal data using a low supply voltage as a pull-up voltage, and a level shifter for receiving the internal data and the inverted internal data, and for generating digital data and inverted digital data in which a pull-up voltage is level-shifted to a high supply voltage. In a normal mode, the internal data and the inverted internal data have logic states corresponding to input data, while the digital data and the inverted digital data have logic states corresponding to the internal data and the inverted internal data. In an HVS test mode, the internal data and the inverted internal data are controlled such that they have respective internal logic states regardless of the logic state of the input data, while the digital data and the inverted digital data have respective predetermined logic states regardless of logic states of the internal data and the inverted internal data.

In an alternative exemplary embodiment of the present invention, an HVS test circuit includes: an internal data generation unit for generating internal data and inverted internal data using a low supply voltage as a pull-up voltage; and a level shifter for receiving the internal data and the inverted internal data and for generating digital data and inverted digital data in which a pull-up voltage is level-shifted to a high supply voltage. In a normal mode, the internal data and the inverted internal data have logic states corresponding to input data, while the digital data and the inverted digital data have logic states corresponding to the internal data and the inverted internal data, respectively. In an HVS test mode, the internal data and the inverted internal data have a ground voltage regardless of a logic state of the input data, while, the digital data and the inverted digital data have one of the high supply voltage and the ground voltage regardless of logic states of the internal data and the inverted internal data.

In yet another alternative exemplary embodiment of the present invention, an HVS test circuit includes: an internal data generation unit for generating internal data and inverted internal data using a low supply voltage as a pull-up voltage; and a level shifter for receiving the internal data and the inverted internal data and for generating digital data and inverted digital data in which a pull-up voltage is level-shifted to a high supply voltage. In a normal mode, the internal data and the inverted internal data have logic states corresponding to input data, and the digital data and the inverted digital data have logic states corresponding to the internal data and the inverted internal data. In a high voltage stress test mode, the internal data and the inverted internal data are controlled such that they have the low supply voltage regardless of a logic state of the input data, and the digital data and the inverted digital data have the ground voltage regardless of logic states of the internal data and the inverted internal data.

BRIEF DESCRIPTION OF THE DRAWINGS

The above and other aspects, features and advantages of the present invention will be more readily apparent by describing in further detail exemplary embodiments thereof with reference to the accompanying drawings, in which.

DETAILED DESCRIPTION OF THE INVENTION

Figure 1:
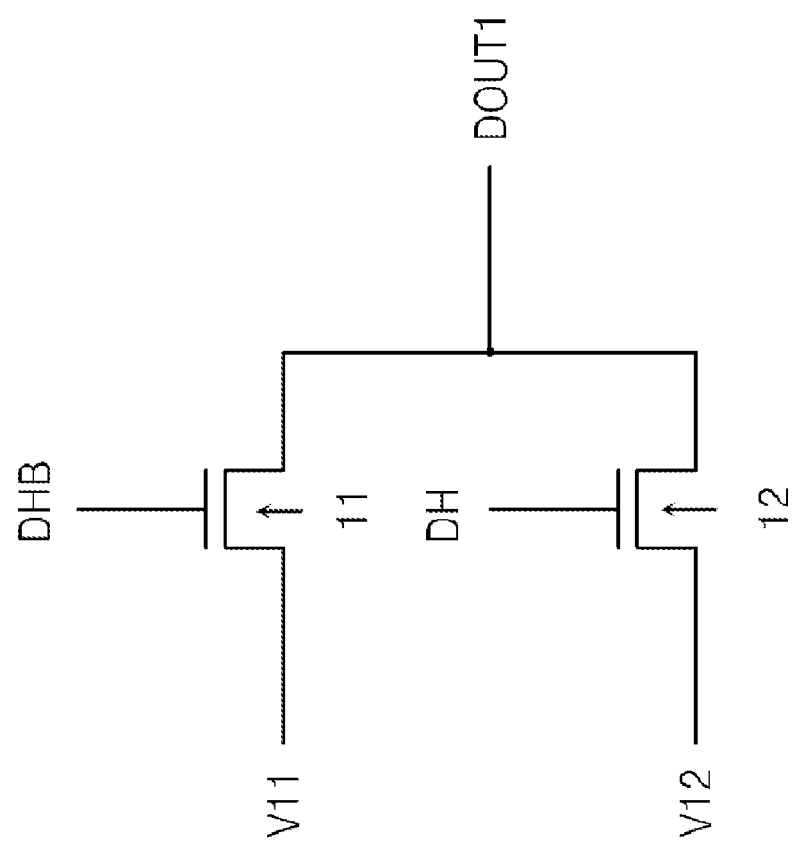
FIG. 1 is a schematic diagram illustrating an n-channel metal oxide semiconductor ("NMOS") according to the prior art.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Exemplary embodiments of the present invention will now be described in further detail with reference to the accompanying drawings.

Figure 5:
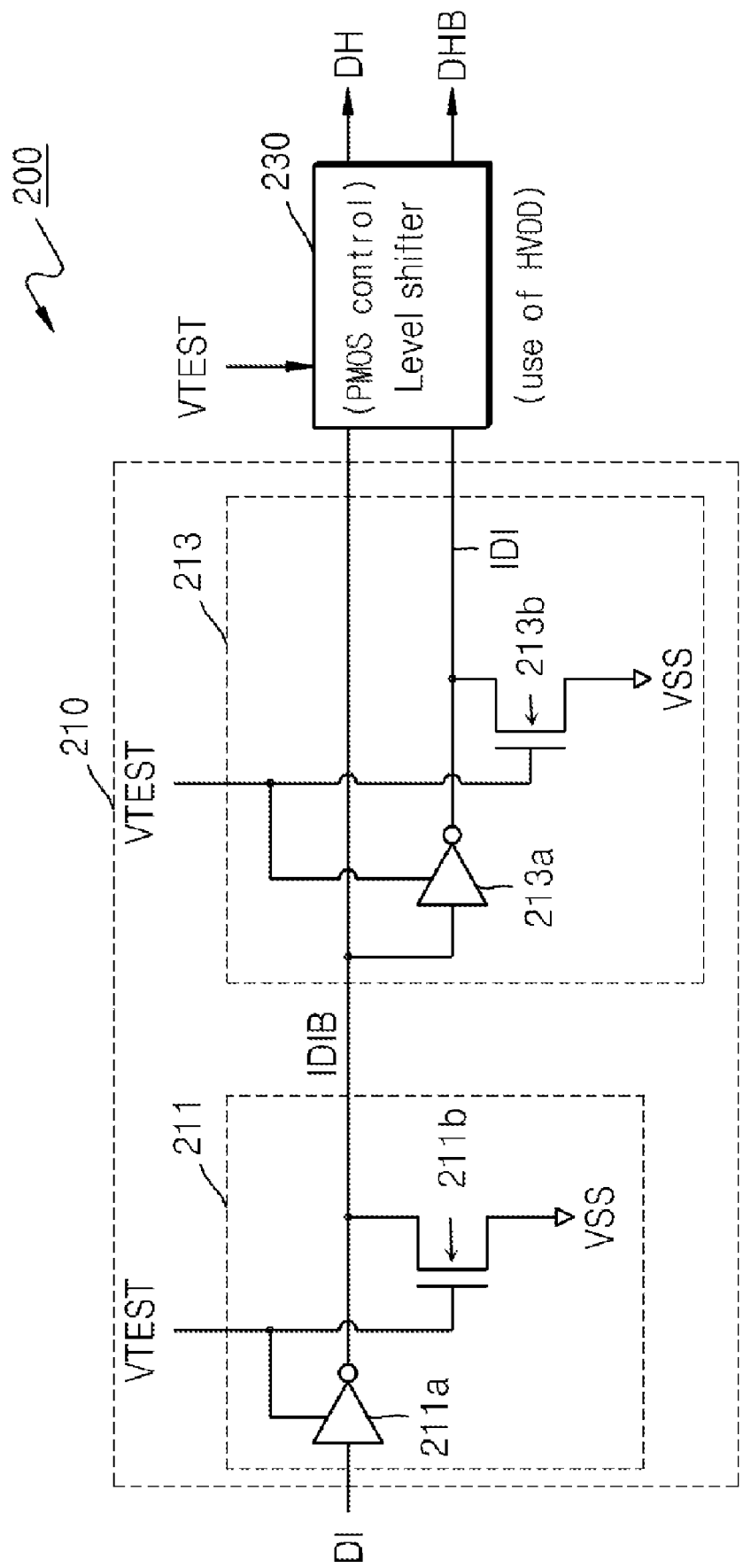
FIG. 5 is a schematic diagram of an exemplary embodiment of an HVS test circuit according to the present invention.
Figure 6:
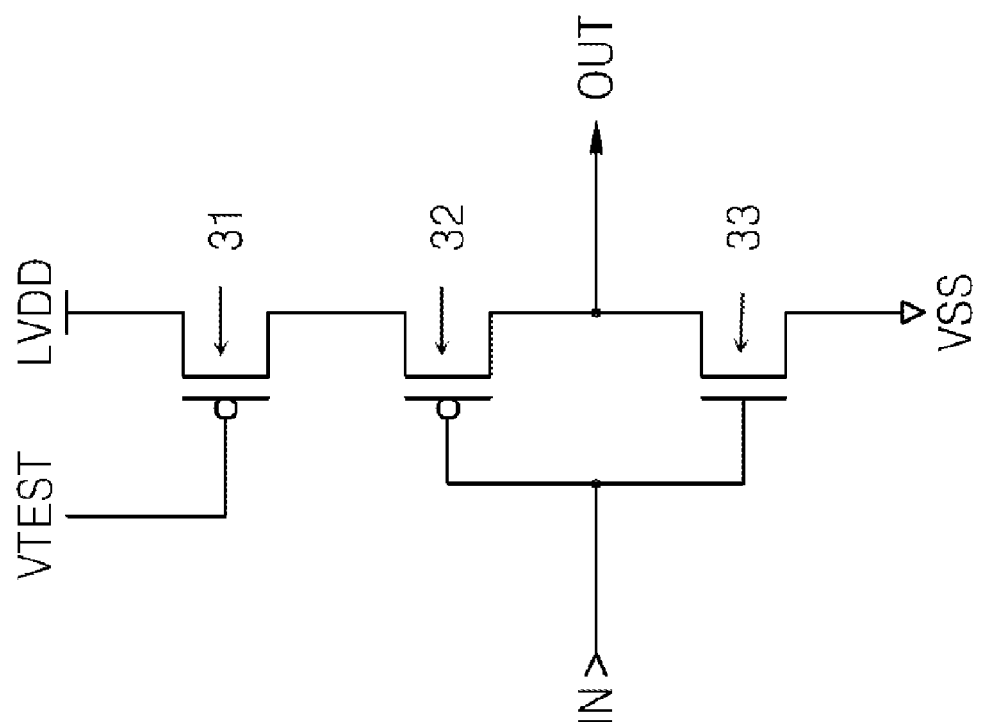
FIG. 6 is a schematic diagram of an exemplary embodiment of a tri-state inverter of the HVS test circuit shown in FIG. 5.

FIG. 5 is a schematic diagram of an HVS test circuit 200 according to an exemplary embodiment of the present invention. FIG. 6 is a schematic diagram of an exemplary embodiment of a tri-state inverter of the HVS test circuit 200 shown in FIG. 5 Referring to FIG. 5, the HVS test circuit 200 of the present embodiment includes an internal data generation unit 210 and a level shifter 230. In an exemplary embodiment, the internal data generation unit 210 uses a low supply voltage LVDD as pull-up voltage, while the level shifter 230 uses a high supply voltage HVDD as pull-up voltage.

The internal data generation unit 210 receives input data DI, and generates internal data IDI and inverted internal data IDIB.

In greater detail, the internal data generation unit 210 includes an inverted internal data generation part 211 and an internal data generation part 213, as shown in FIG. 5.

In normal mode, e.g., an operating mode of the HVS test circuit 200 in which a test mode signal VTEST is deactivated to have a logic state ("L"), e.g., a low logic state, the inverted internal data generation part 211 generates the inverted internal data IDIB by inverting the input data DI. Meanwhile, in HVS test mode, e.g., an operating mode of the HVS test circuit 200 in which the test mode signal VTEST is activated to have a logic state ("H"), e.g., a high logic state, the inverted internal data generation part 211 controls the inverted internal data IDIB to be at a ground voltage VSS.

Thus, in normal mode, the internal data generation part 213 generates the internal data IDI by inverting the inverted internal data IDIB. In the HVS test mode, however, the internal data generation part 213 controls the internal data IDI so that it has the ground voltage VSS.

In greater detail, the inverted internal data generation part 211 includes a first tri-state inverter 211a and a first transistor 211b. As shown in FIG. 6, the first tri-state inverter 211a according to an exemplary embodiment of the present invention includes p-channel metal oxide semiconductor ("PMOS") transistors 31 and 32, and an n-channel metal oxide semiconductor ("NMOS") transistor 33, but alternative exemplary embodiments are not limited thereto. In normal mode, the first tri-state inverter 211a generates the inverted internal data IDIB by inverting the input data DI. When the test mode signal VTEST is at logic state "L," the first tri-state inverter 211a generates an output signal OUT by inverting an input signal IN, as shown in FIG. 6. In contrast, when the test mode signal VTEST is at logic state "H," the output signal OUT is in a high impedance state with respect when to the input signal IN is at logic state "L."

Meanwhile, in HVS test mode, the first transistor 211b controls the inverted internal data IDIB such that the inverted internal data IDIB is at the ground voltage VSS.

Thus, the inverted internal data generation part 211 operates essentially as a NOR gate which has the input data DI and the test mode signal VTEST as inputs and outputs the inverted internal data IDIB.

In an exemplary embodiment, the internal data generation part 213 includes a second tri-state inverter 213a and a second transistor 213b. In the normal mode, the second tri-state inverter 213a generates the internal data IDI by inverting the inverted internal data IDIB. In HVS test mode, the second transistor 213b controls the internal data IDI such that the internal data IDI is maintained at the ground voltage VSS.

Put another way, the internal data generation part 213 operates substantially as a NOR gate having the inverted internal data IDIB and the test mode signal VTEST as inputs and which outputs the internal data IDI.

Logic states of the internal data IDI and the inverted internal data IDIB generated in the internal data generation unit 210 according to an exemplary embodiment are controlled as described in further detail below.

In normal mode, the internal data IDI and the inverted internal data IDIB have respective logic states corresponding to the input data DI. For example, in normal mode, when the input data DI has logic state "H," the internal data IDI and the inverted internal data IDIB have logic states "H" and "L," respectively.

In contrast, in HVS test mode, the internal data IDI and the inverted internal data IDIB each have predetermined logic states such as logic state "L", as illustrated in the exemplary embodiment shown in FIG. 5, regardless of a logic state of the input data DI. Specifically, in HVS test mode, the internal data IDI and the inverted internal data IDIB are controlled such that they each have logic state "L" regardless of whether the input data DI has logic state "H" or logic state "L".

Figure 2:
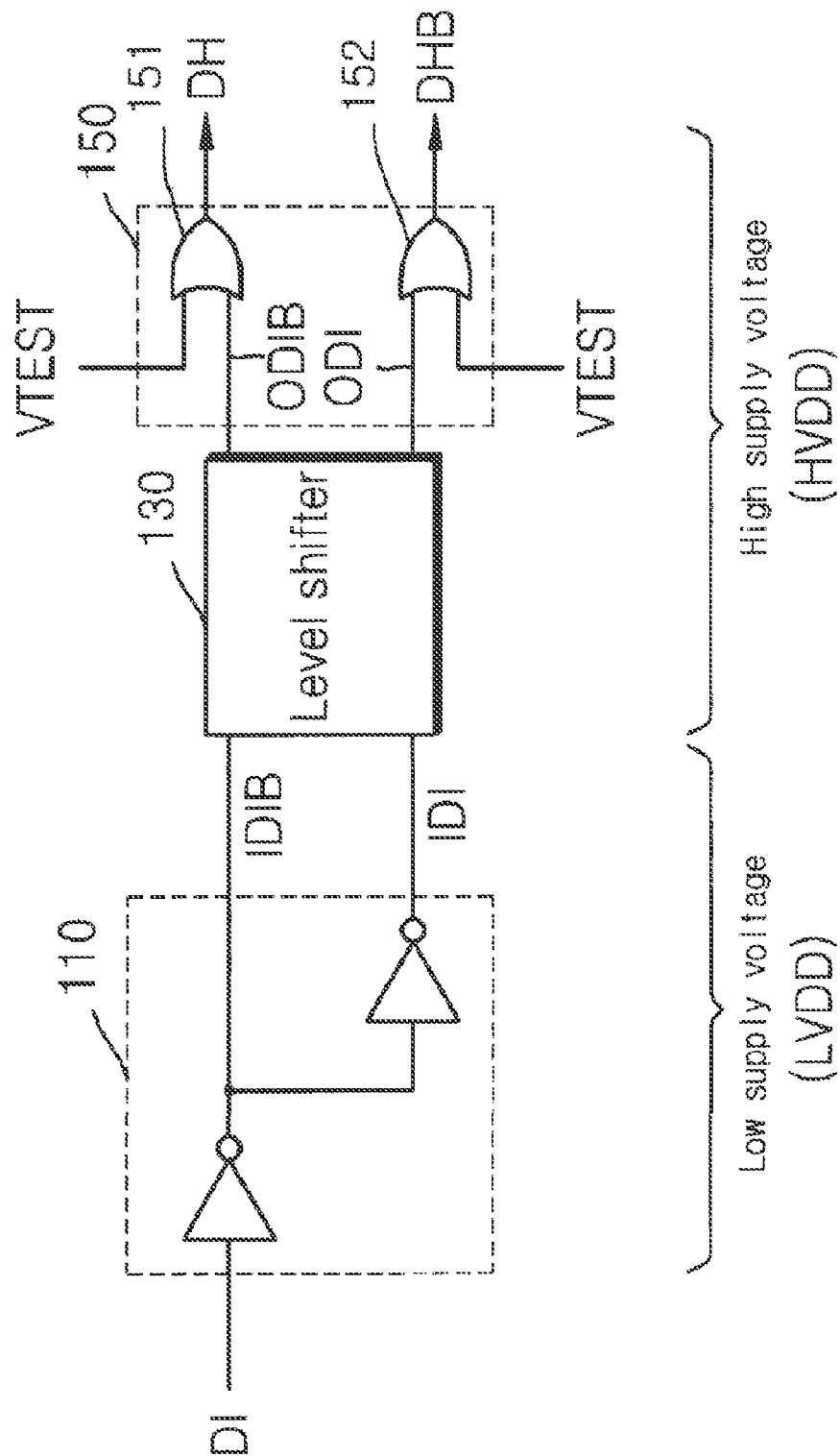
FIG. 2 is a schematic diagram illustrating a high voltage stress ("HVS") test circuit according to the prior art.

It will be noted that, in the HVS test circuit 200 according to an exemplary embodiment of the present invention as shown in FIG. 5, the internal data generation unit 210 controls the internal data IDI and the inverted internal data IDIB such that they have predetermined internal logic states regardless of a logic state of the input data DI in HVS test mode, unlike the internal data generation unit 110 of the HVS test circuit according to the prior art described in greater detail above with reference to FIG. 2.

Still referring to FIG. 5, the level shifter 230 according to an exemplary embodiment receives the internal data IDI and the inverted internal data IDIB, and generates digital data DH and inverted digital data DHB, a pull-up voltage of which is level-shifted to the high supply voltage HVDD.

Figure 7:
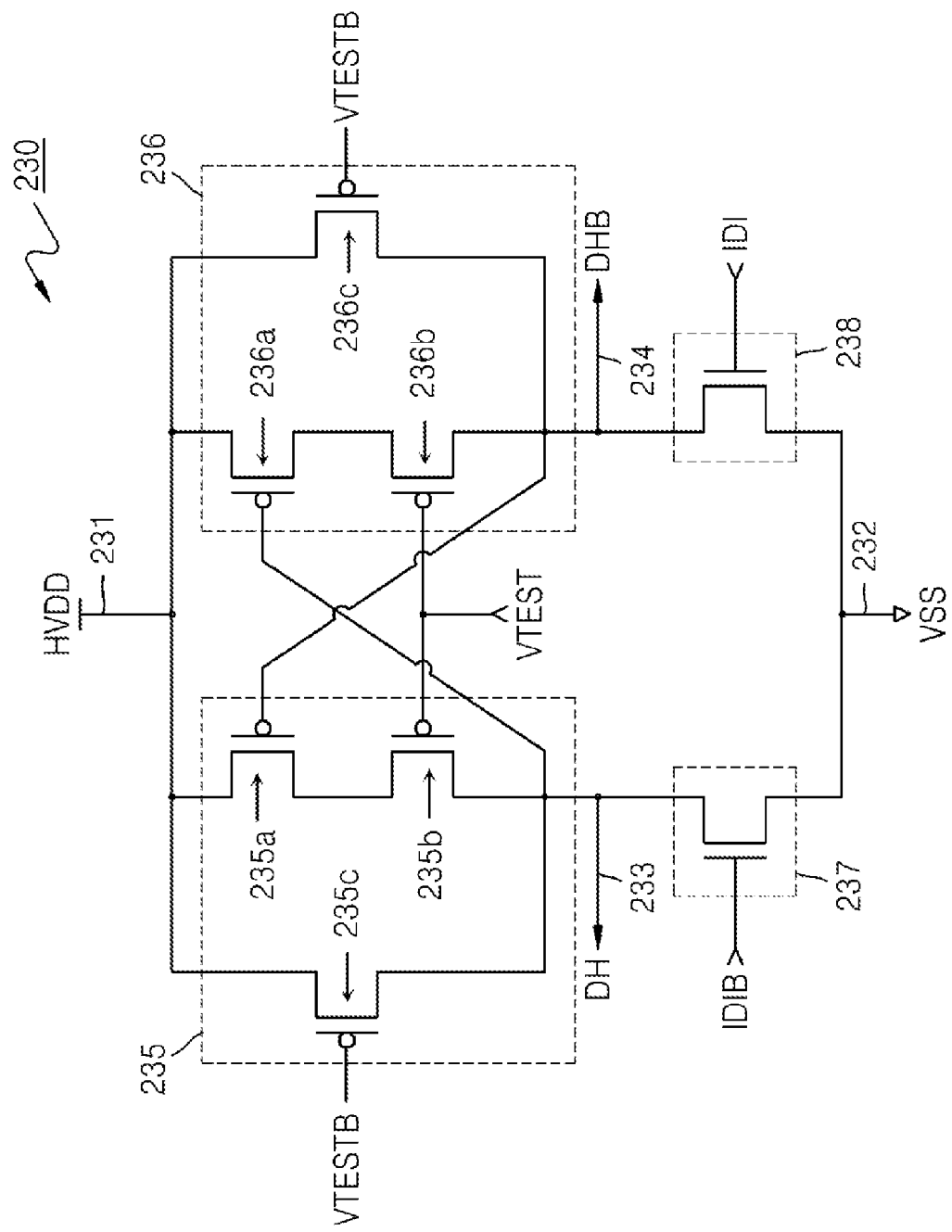
FIG. 7 is a schematic diagram of an exemplary embodiment of a level shifter of the HVS test circuit shown in FIG. 5.

FIG. 7 is a schematic diagram of the level shifter 230 according to the exemplary embodiment of the present invention shown in FIG. 5. The level shifter 230 shown in FIG. 7 is a PMOS control-type level shifter in which a PMOS transistor performs a control function in HVS test mode. Specifically and as shown in FIG. 7, the level shifter 230 according to an exemplary embodiment includes a power terminal 231, a ground terminal 232, an output terminal 233, an inverted output terminal 234, an output pull-up unit 235, an inverted output pull-up unit 236, an output pull-down unit 237, and an inverted output pull-down unit 238.

The high supply voltage HVDD is applied to the power terminal 231, while the ground voltage VSS is applied to the ground terminal 232. Meanwhile, the output terminal 233 provides the digital data DH, while the inverted output terminal 234 provides the inverted digital data DHB.

The output pull-up unit 235 is disposed between the power terminal 231 and the output terminal 233, as shown in FIG. 7. In normal mode, the output pull-up unit 235 pulls up the digital data DH to the high supply voltage HVDD in response to the pulling down of the inverted digital data DHB. In contrast, in HVS test mode, the output pull-up unit 235 pulls up the digital data DH regardless of a logic state of the inverted digital data DHB.

In an exemplary embodiment of the present invention, the output pull-up unit 235 includes first through third PMOS transistors 235a through 235c, respectively, as shown in FIG. 7.

Specifically, the first PMOS transistor 235a is disposed between the power terminal 231 and the output terminal 233, and is gated by the inverted digital data DHB.

The second PMOS transistor 235b is disposed between the power terminal 231 and the output terminal 233 and is in electrical series with the first PMOS transistor 235a. The second PMOS transistor 235b is turned off in response to the test mode signal VTEST.

The third PMOS transistor 235c is disposed between the power terminal 231 and the output terminal 233, and is in electrical parallel with the first PMOS transistor 235a and the second PMOS transistor 235b. The third PMOS transistor 235c is turned on in response to activation of the test mode signal VTEST, e.g., based on transition of an inverted signal VTESTB of the test mode signal VTEST to logic state "L," and then pulls up the digital data DH to the high supply voltage HVDD.

The inverted output pull-up unit 236 is disposed between the power terminal 231 and the inverted output terminal 234. In normal mode, the inverted output pull-up unit 236 pulls up the inverted digital data DHB to the high supply voltage HVDD in response to the pulling down of the digital data DH. In HVS test mode, however, the inverted output pull-up unit 236 pulls up the inverted digital data DHB regardless of the logic state of the digital data DH.

Still referring to FIG. 7, the inverted output pull-up unit 236 according to an exemplary embodiment includes fourth through sixth PMOS transistors 236a through 236c, respectively.

More specifically, the fourth PMOS transistor 236a is disposed between the power terminal 231 and the inverted output terminal 234, and is gated by the digital data DH.

The fifth PMOS transistor 236b is disposed between the power terminal 231 and the inverted output terminal 234 and is in electrical series with the fourth PMOS transistor 236a. The fifth PMOS transistor 236b is turned off in response to the test mode signal VTEST.

The sixth PMOS transistor 236c is disposed between the power terminal 231 and the output terminal 233 and in electrical parallel with the fourth PMOS transistor 236a and the fifth PMOS transistor 236b. The sixth PMOS transistor 236c is turned on in response to the activation of the test mode signal VTEST, and pulls up the inverted digital data DHB to the high supply voltage HVDD.

As shown in FIG. 7, the output pull-down unit 237 is disposed between the ground terminal 232 and the output terminal 233. The output pull-down unit 237 pulls down the digital data DH to the ground voltage VSS in response to the pulling up of the inverted input data IDIB.

In addition, the inverted output pull-down unit 238 is disposed between the ground terminal 232 and the inverted output terminal 234. The inverted output pull-down unit 238 pulls down the inverted digital data DHB to the ground voltage VSS in response to the pulling up of the input data IDI.

Logic states of the digital data DH and the inverted digital data DHB generated in the level shifter 230 according to an exemplary embodiment of the present invention are controlled as will be described in further detail below.

In normal mode, for example, the digital data DH and the inverted digital data DHB have logic states corresponding to the internal data IDI and the inverted internal data IDIB, as described above. In contrast, such as in HVS test mode, for example, the digital data DH and the inverted digital data DHB are controlled such that they have a predetermined output logic state (e.g., logic state "H", as shown in the exemplary embodiment of the present invention shown in FIG. 5) regardless of logic states of the internal data IDI and the inverted internal data IDIB.

Thus, the digital data DH and the inverted digital data DHB generated in the level shifter 230 of the HVS test circuit 200 according to an exemplary embodiment of the present invention can be directly used in an NMOS decoder without requiring the digital data DH and the inverted digital data DHB to pass through a separate logic circuit.

Figure 3:
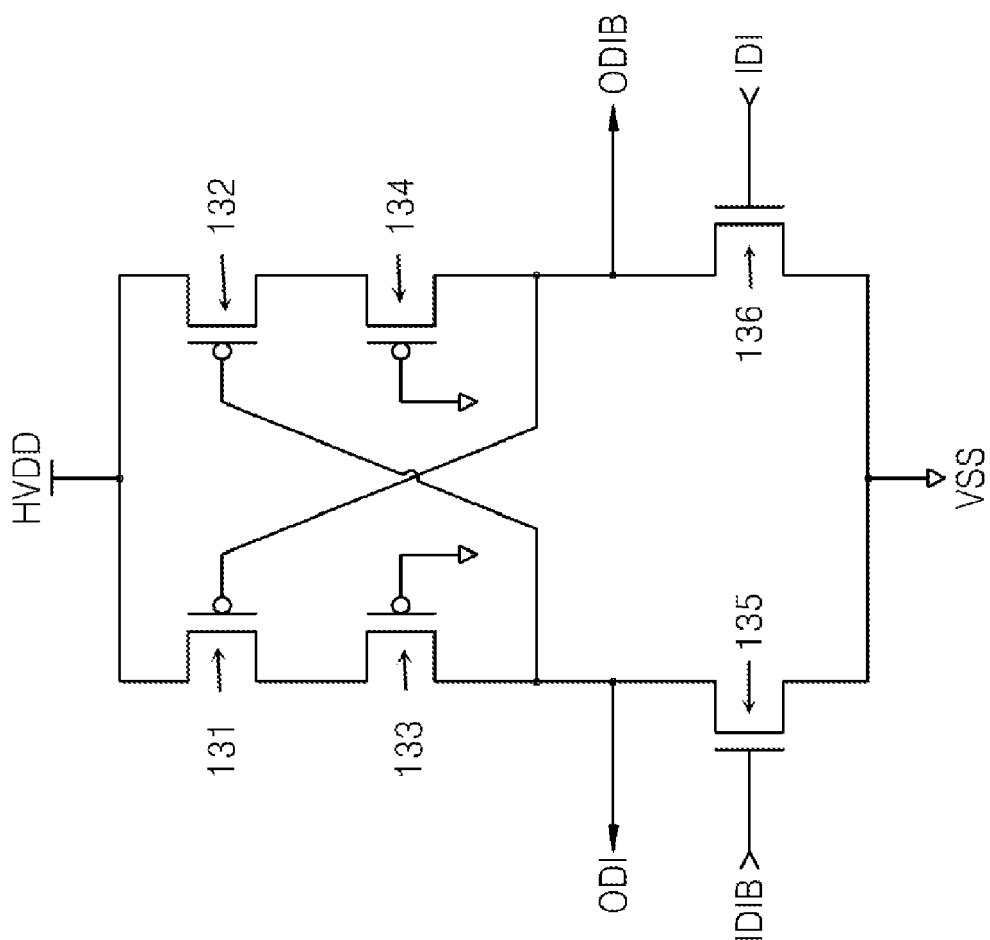
FIG. 3 is a schematic diagram illustrating a level shifter of the HVS test circuit according to the prior art shown in FIG. 2.
Figure 4:
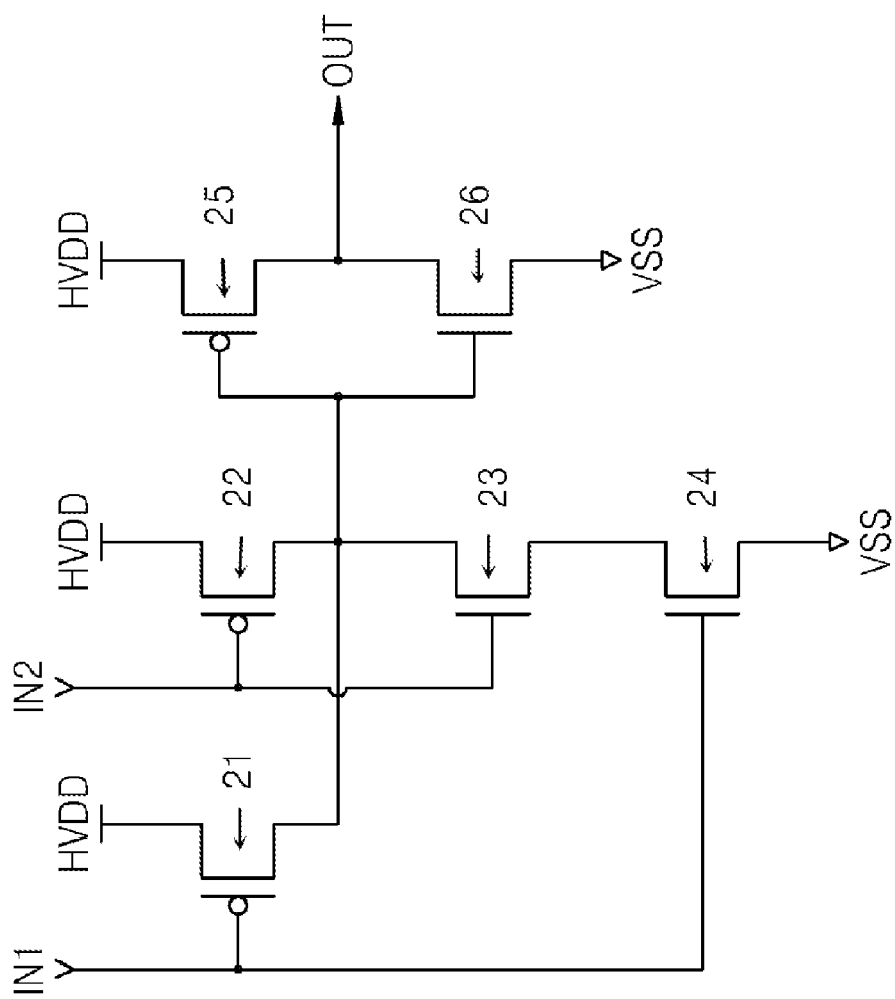
FIG. 4 is a schematic diagram illustrating a logical sum gate of the HVS test circuit according to the prior art shown in FIG. 2.

Accordingly, a number of transistors using the high supply voltage HVDD in the HVS test circuit 200 according to an exemplary embodiment of the present invention is substantially reduced and/or is effectively minimized, compared to in the HVS test circuit of the prior art, as described above with reference to FIGS. 2 to 4. For example, numbers of transistors using both the low power supply voltage LVDD and the high power supply voltage HVDD in both the HVS test circuit 200 according to an exemplary embodiment of the present invention, as well as the an HVS test circuit of the prior art, are listed in Table 1.

TABLE 1

| | Prior art | Present invention |
|---|---|---|
| Number of transistors using low power supply voltage (LVDD) | 4 | 8 |
| Number of transistors using high power supply voltage (HVDD) | 18 | 8 |

As shown in Table 1, a number of transistors using the low supply voltage LVDD according to the present invention may be somewhat increased in the HVS test circuit 200 according to an exemplary embodiment of the present invention, as compared to an HVS test circuit of the prior art. However, a transistor using high supply voltage HVDD requires a layout area approximately four times as large as a layout area required for a transistor using the low supply voltage LVDD. Thus, the HVS test circuit 200 according to an exemplary embodiment of the present invention requires approximately ½ a layout area of the HVS test circuit of the prior art.

It will be noted that exemplary embodiments of the present invention may be implemented in an HVS test circuit for PMOS decoders, as well, and that alternative exemplary embodiments of the present invention are not limited thereto.

Figure 8:
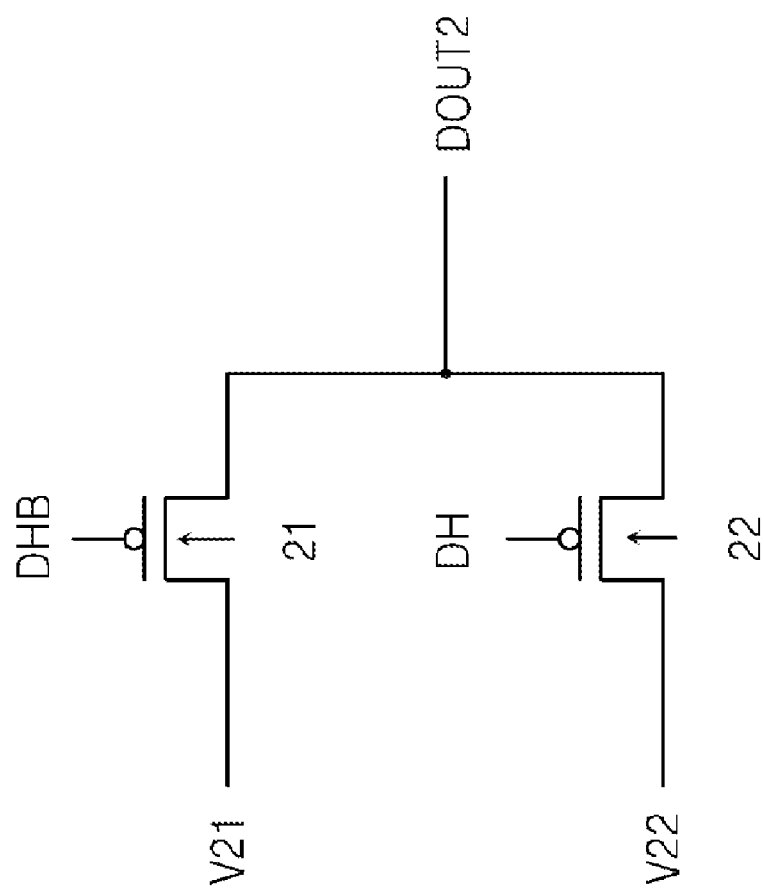
FIG. 8 is a schematic diagram of an exemplary embodiment of a p-channel metal oxide semiconductor ("PMOS") decoder utilizing an HVS test circuit according to an exemplary embodiment of the present invention.

FIG. 8 is a schematic diagram of a PMOS decoder according to an exemplary embodiment of the present invention. Specifically, in FIG. 8, a 1-bit PMOS decoder is shown for purposes of illustration, and it will be noted that alternative exemplary embodiments are not limited thereto. The PMOS decoder of FIG. 8 generates one of two input voltage levels V21 and V22 as a voltage level of an output signal DOUT2, based on a logic state of the input digital data DH in normal mode.

Specifically, to quickly conduct an HVS test of transistors 21 and 22 in the PMOS decoder shown in FIG. 8, the digital data DH and the inverted digital data DHB, both at the ground voltage VSS, are applied to the transistors 21 and 22 when the input voltage levels V21 and V22 are controlled such that they are at the high supply voltage HVDD.

To conduct the HVS test, the digital data DH and the inverted digital data DHB provided by the HVS test circuit 200 (FIG. 5) to have the ground voltage VSS in HVS test mode, regardless of a logic state of the input data.

Figure 9:
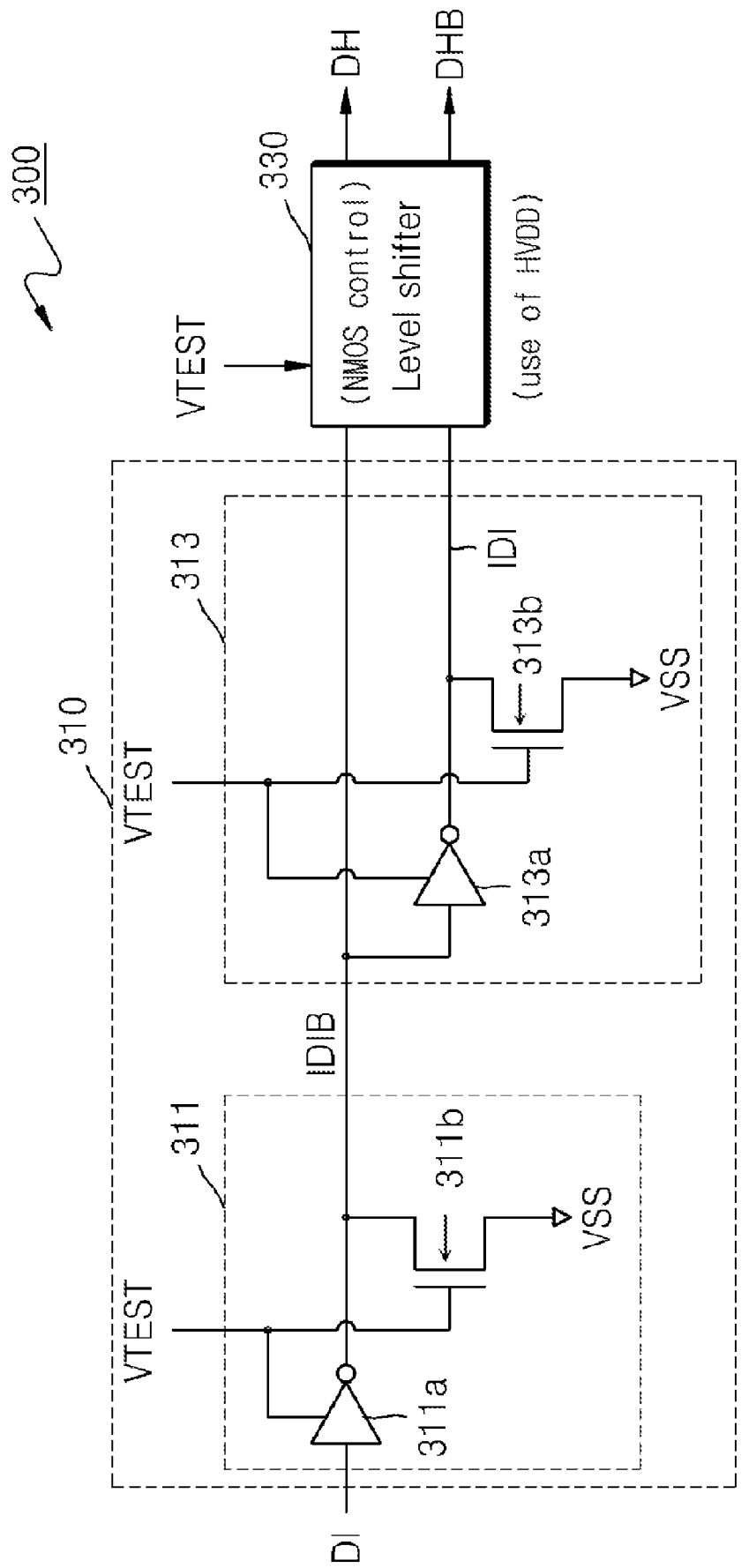
FIG. 9 is a schematic diagram of an alternative exemplary embodiment of an HVS test circuit according to the present invention.

FIG. 9 is a schematic diagram of an HVS test circuit 300 according to an alternative exemplary embodiment of the present invention. It will be noted that the HVS test circuit 300 shown in FIG. 9 may be applied to the PMOS decoder shown in FIG. 8, for example, but alternative exemplary embodiments are not limited thereto.

Referring to FIG. 9, the HVS test circuit 300 includes an internal data generation unit 310 and a level shifter 330. In an exemplary embodiment, the internal data generation unit 310 uses low supply voltage LVDD as pull-up voltage, while the level shifter 330 uses high supply voltage HVDD as pull-up voltage.

The internal data generation unit 310 receives input data DI and generates internal data IDI and inverted internal data IDIB. The internal data generation unit 310 is substantially the same as the internal data generation unit 210 described in greater detail above with reference to FIG. 5. Thus, for ease of description, repetitive detailed descriptions thereof will hereinafter be omitted.

Referring to FIG. 9, the level shifter 330 according to an exemplary embodiment receives the internal data IDI and the inverted internal data IDIB, and generates digital data DH and inverted digital data DHB in which pull-up voltage is level-shifted to the high supply voltage HVDD.

Figure 10:
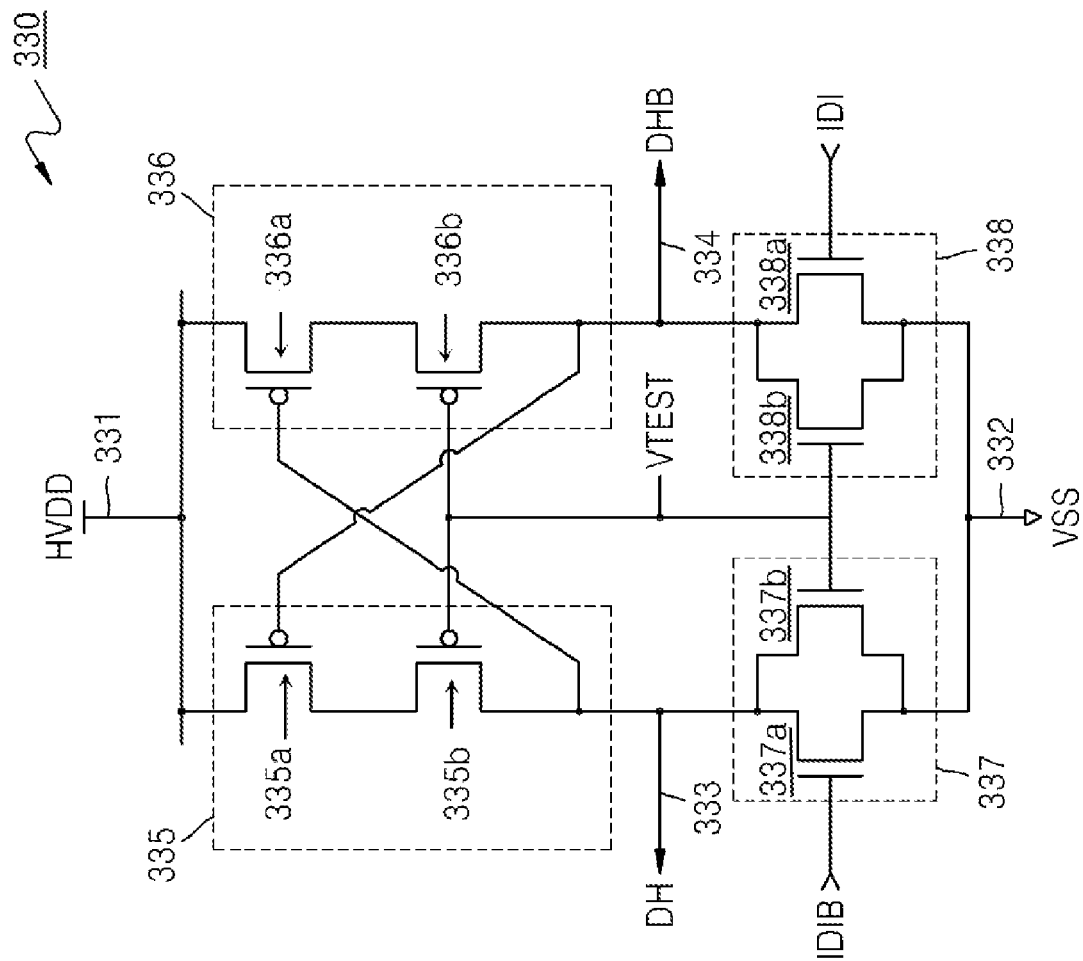
FIG. 10 is a schematic diagram an exemplary embodiment of a level shifter of the HVS test circuit shown in FIG. 9.

FIG. 10 is a schematic diagram of the level shifter 330 of the HVS test circuit 300 according to the exemplary embodiment of the present invention shown in FIG. 9. As described in greater detail above, the level shifter 230 according to the exemplary embodiment of the present invention shown in FIG. 7 is a PMOS control-type level shifter, whereas the level shifter 330 of the alternative exemplary embodiment shown in FIG. 10 is an NMOS control-type level shifter in which an NMOS transistor performs a control function in HVS test mode.

Referring to FIG. 10, the level shifter 330 according to an exemplary embodiment includes a power terminal 331, a ground terminal 332, an output terminal 333, an inverted output terminal 334, an output pull-up unit 335, an inverted output pull-up unit 336, an output pull-down unit 337, and an inverted output pull-down unit 338.

The high supply voltage HVDD is applied to the power terminal 331, while the ground voltage VSS is applied to the ground terminal 332. The output terminal 333 outputs the digital data DH, while the inverted output terminal 334 outputs the inverted digital data DHB.

The output pull-up unit 335 is disposed between the power terminal 331 and the output terminal 333. In normal mode, the output pull-up unit 235 pulls up the digital data DH to the high supply voltage HVDD in response to a pulling down of the inverted digital data DHB. However, in HVS test mode, the output pull-up unit 235 cuts off, e.g. electrically disconnects, a connection between the output terminal 333 and the power terminal 331 regardless of the logic state of the inverted digital data DHB. As a result, the pulling up of the digital data DH is effectively prevented.

More particularly, the output pull-up unit 335 according to an exemplary embodiment includes first and second PMOS transistors 335a and 335b, respectively.

The first PMOS transistor 335a is disposed between the power terminal 331 and the output terminal 333, and is gated by the inverted digital data DHB.

The second PMOS transistor 335b is disposed between the power terminal 331 and the output terminal 333 in electrical series with the first PMOS transistor 335a. The second PMOS transistor 335b is turned off in response to the test mode signal VTEST. Thus, in HVS test mode, the second PMOS transistor 335b is turned off regardless of a logic state of the inverted digital data DHB, and thereby blocks a pulling up of the digital data DH.

The inverted output pull-up unit 336 is disposed between the power terminal 331 and the inverted output terminal 334. In normal mode, the inverted output pull-up unit 336 pulls up the inverted digital data DHB to the high supply voltage HVDD in response to the pulling down of the digital data DH. However, in HVS test mode, the output pull-up unit 336 cuts off, e.g., electrically disconnects, a connection between the inverted output terminal 334 and the power terminal 331 regardless of a logic state of the digital data DH, and thereby blocks, e.g., effectively prevents, a pulling up of the inverted digital data DHB.

More specifically, the inverted output pull-up unit 336 includes third and fourth PMOS transistors 336a and 336b, respectively.

The third PMOS transistor 336a is disposed between the power terminal 331 and the inverted output terminal 334, and is gated by the digital data DH.

The fourth PMOS transistor 336b is disposed between the power terminal 331 and the inverted output terminal 334 and in electrical series with the third PMOS transistor 336a. The fourth PMOS transistor 336b is turned off in response to the test mode signal VTEST. Thus, in HVS test mode, the fourth PMOS transistor 336b is turned off regardless of a logic state of the digital data DHB, and therefore blocks the pulling up of the inverted digital data DHB.

The output pull-down unit 337 is disposed between the ground terminal 332 and the output terminal 333. The output pull-down unit 337 pulls down the digital data DH to the ground voltage VSS in response to the pulling up of the inverted input data IDIB. In HVS test mode, the output pull-down unit 337 pulls down the digital data DH regardless of the logic state of the inverted internal data IDIB.

In an exemplary embodiment, the output pull-down unit 337 includes first and second NMOS transistors 337a and 337b, respectively.

The first NMOS transistor 337a is disposed between the ground terminal 332 and the output terminal 333, and is gated by the inverted internal data IDIB.

The second NMOS transistor 337b is disposed between the ground terminal 332 and the output terminal 333 and in electrical parallel with the first NMOS transistor 337a. The second NMOS transistor 337b is turned on in response to the activation of the test mode signal VTEST to logic state "H," and pulls down the digital data DH to the ground voltage VSS.

The inverted output pull-down unit 338 is disposed between the ground terminal 332 and the inverted output terminal 334. The inverted output pull-down unit 338 pulls down the inverted digital data DHB to the ground voltage VSS in response to the pulling up of the input data IDI. In HVS test mode, the inverted output pull-down unit 338 pulls down the inverted digital data DHB regardless of the logic state of the internal data IDI.

As shown in FIG. 10, the output pull-down unit 338 according to an exemplary embodiment includes third and fourth NMOS transistors 338a and 338b, respectively.

The third NMOS transistor 338a is disposed between the ground terminal 332 and the inverted output terminal 334, and is gated by the internal data IDI.

The fourth NMOS transistor 338b is disposed between the ground terminal 332 and the inverted output terminal 334 and in electrical parallel with the third NMOS transistor 338a. The fourth NMOS transistor 338b is turned on in response to the activation of the test mode signal VTEST to logic state "H," and pulls down the inverted digital data DHB to the ground voltage VSS.

Logic states of the digital data DH and the inverted digital data DHB generated by the level shifter 330 according to an exemplary embodiment of the present invention are controlled as will be described in further detail below.

In normal mode, the digital data DH and the inverted digital data DHB have logic states corresponding to the internal data IDI and the inverted internal data IDIB, respectively. In contrast, in HVS test mode, the digital data DH and the inverted digital data DHB are controlled such that they each have a predetermined output logic state (e.g., logic state "L", as in the exemplary embodiment of the present invention shown in FIG. 9) regardless of logic states of the internal data IDI and the inverted internal data IDIB.

Thus, the digital data DH and the inverted digital data DHB generated by the level shifter 330 of the HVS test circuit according to an exemplary embodiment of the present invention can be directly used in a PMOS decoder without passing through a separate logic circuit.

Therefore, numbers of transistors using the high supply voltage HVDD in the HVS test circuit 300 according to an exemplary embodiment of the present invention shown in FIGS. 9 and 10 are substantially reduced and/or effectively minimized, compared to in an HVS test circuit of the prior art.

Figure 11:
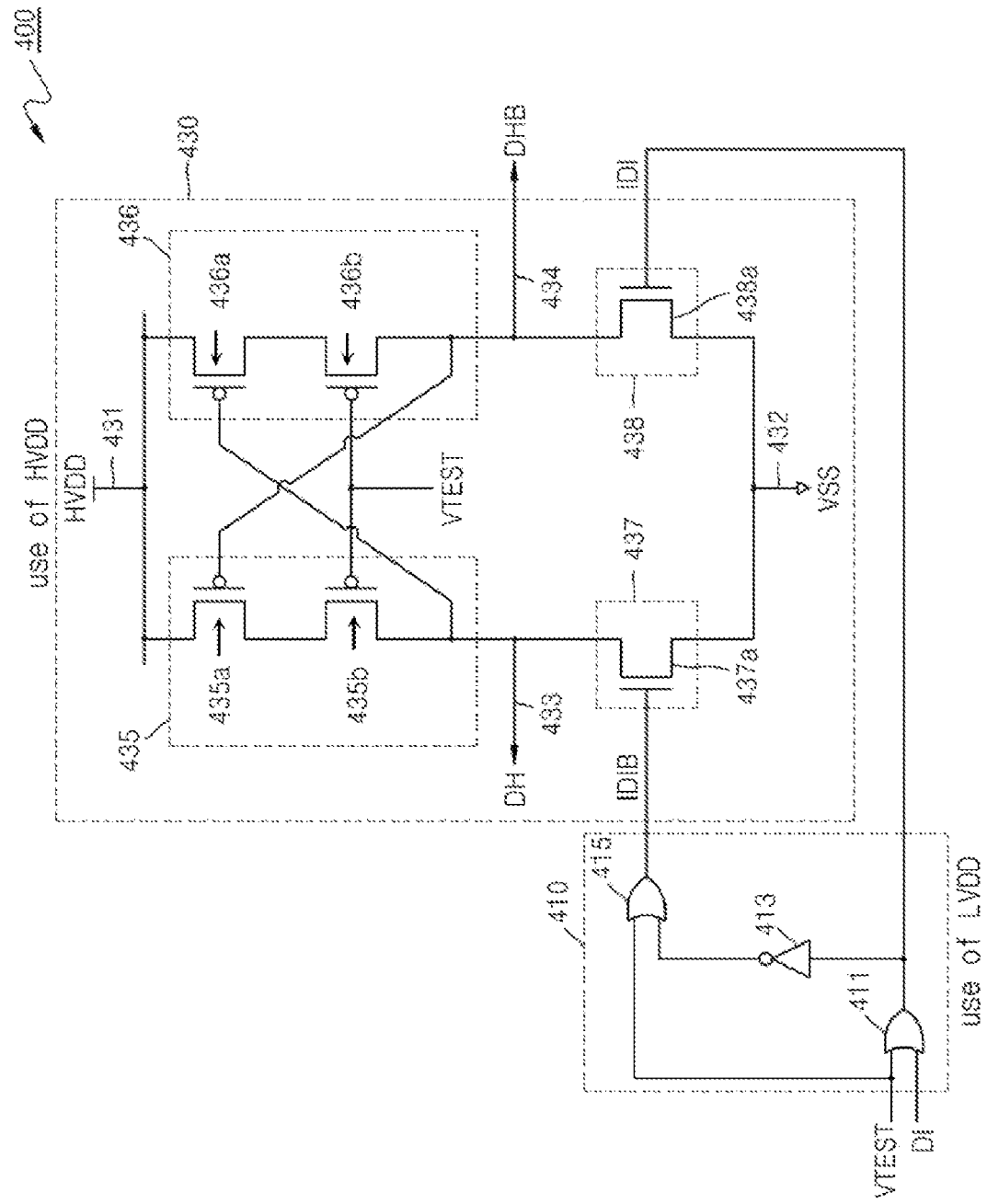
FIG. 11 is a schematic diagram of another alternative exemplary embodiment of an HVS test circuit according to the present invention.

FIG. 11 is a schematic diagram of an HVS test circuit 400 according to another alternative exemplary embodiment of the present invention. It will be noted that the HVS test circuit 400 can be applied to the PMOS decoder according to the exemplary embodiment shown in FIG. 8, but alternative exemplary embodiments are not limited thereto.

Referring to FIG. 11, the HVS test circuit 400 according to an exemplary embodiment of the present invention includes an internal data generation unit 410 and a level shifter 430. Specifically, the internal data generation unit 410 uses low supply voltage LVDD as a pull-up voltage, while the level shifter 430 uses high supply voltage HVDD as a pull-up voltage.

The internal data generation unit 410 receives input data DI, and generates internal data IDI and inverted internal data IDIB.

As shown in FIG. 11, the internal data generation unit 410 includes a first logical sum part 411, an inverter 413, and a second logical sum part 415.

In normal mode in which a test mode signal VTEST is deactivated to logic state "L," the first logical sum part 411 generates the internal data IDI based on the input data DI. Meanwhile, in HVS test mode in which a test mode signal VTEST is activated to logic state "H," the first logical sum part 411 controls the internal data IDI such that the internal data IDI is at the low supply voltage LVDD.

The inverter 413 inverts the output of the first logical sum part 411.

Meanwhile, in normal mode, the second logical sum part 415 generates the inverted internal data IDIB based on the output of the inverter 413. In HVS test mode, the second logical sum part 415 controls the inverted internal data IDIB such that the inverted internal data IDIB is at the low supply voltage LVDD.

Logic states of the internal data IDI and the inverted internal data IDIB generated in the internal data generation unit 410 according to an exemplary embodiment are controlled as will be described in further detail below.

In normal mode, the internal data IDI and the inverted internal data IDIB have respective logic states corresponding to the input data DI. For example, in normal mode, when the input data DI has logic state "H," the internal data IDI and the inverted internal data IDIB have logic states "H" and logic state "L", respectively.

In contrast, in HVS test mode, the internal data IDI and the inverted internal data IDIB are each at the low supply voltage LVDD regardless of the logic state of the input data DI.

Still referring to FIG. 11, the level shifter 430 receives the internal data IDI and the inverted internal data IDIB, and generates digital data DH and inverted digital data DHB in which pull-up voltage is level-shifted to the high supply voltage HVDD.

The level shifter 430 according to an exemplary embodiment includes a power terminal 431, a ground terminal 432, an output terminal 433, an inverted output terminal 434, an output pull-up unit 435, an inverted output pull-up unit 436, an output pull-down unit 437, and an inverted output pull-down unit 438. The power terminal 431, the ground terminal 432, the output terminal 433, the inverted output terminal 434, the output pull-up unit 435 and the inverted output pull-up unit 436 of the level shifter 430 according to the exemplary embodiment shown in FIG. 11 are substantially the same as the power terminal 331, the ground terminal 332, the output terminal 333, the inverted output terminal 334, the output pull-up unit 335 and the inverted output pull-up unit 336, respectively, of the level shifter 330 according to the exemplary embodiment shown in FIG. 10, and any repetitive detailed descriptions thereof have hereinafter been omitted.

In addition, the output pull-down unit 437 and the inverted output pull-down unit 438 of the level shifter 430 of the exemplary embodiment shown in FIG. 11 are substantially the same as the output pull-down unit 337 and the inverted output pull-down unit 338, respectively, of the level shifter 330 of the exemplary embodiment of the present invention shown in FIG. 10, except that the output pull-down unit 337 and the inverted output pull-down unit 338 of the level shifter 330 of FIG. 10 are each implemented using two NMOS transistors, while the output pull-down unit 437 and the inverted output pull-down unit 438 of the level shifter 430 are each implemented using one NMOS transistor, as shown in FIG. 11.

More particularly, the output pull-down unit 437 is disposed between the ground terminal 432 and the output terminal 433. The output pull-down unit 437 pulls down the digital data DH to the ground voltage VSS in response to the inverted input data IDIB. In HVS test mode, the inverted internal data IDIB has logic state "H." Accordingly, in HVS test mode, the output pull-down unit 437 pulls down the digital data DH.

More specifically and still referring to FIG. 11, the output pull-down unit 437 according to an exemplary embodiment includes a first NMOS transistor 437a. The first NMOS transistor 437a is disposed between the ground terminal 432 and the output terminal 433, and is gated by the inverted internal data IDIB.

The inverted output pull-down unit 438 is disposed between the ground terminal 432 and the inverted output terminal 434. The inverted output pull-down unit 438 pulls down the inverted digital data DHB to the ground voltage VSS in response to the pulling up of the input data IDI. In HVS test mode, the inverted internal data IDIB has logic state "H." Accordingly, in HVS test mode, the output pull-down unit 438 pulls down the inverted digital data DHB.

As shown in FIG. 11, the output pull-down unit 438 includes a second NMOS transistor 438a. The second NMOS transistor 438a is disposed between the ground terminal 432 and the inverted output terminal 434, and is gated by the internal data IDI.

Logic states of the digital data DH and the inverted digital data DHB generated by the level shifter 430 according to an exemplary embodiment are substantially the same as the logic states of the digital data DH and the inverted digital data DHB generated by the level shifter 330 of the exemplary embodiment of the present invention shown in FIG. 10.

Thus, a number of transistors using the high supply voltage HVDD in the HVS test circuit 400 according to an exemplary embodiment of the present embodiment as shown in FIG. 11 is further reduced, as compared to those in the HVS test circuit 200 and the HVS test circuit 300 according to exemplary embodiments of the present invention shown in FIGS. 9 and 10, respectively.

Thus, according to exemplary embodiments of the present invention as described herein, in an HVS test circuit, internal data and inverted internal data generated by an internal data generation unit disposed before a level shifter are controlled, in HVS test mode, to have a logic state of high or low. As a result, digital data and inverted digital data provided by the level shifter are directly used in an NMOS decoder or, alternatively, a PMOS decoder without being required to pass through a separate logic circuit.

As a result, a number of transistors using a high supply voltage HVDD is substantially reduced and/or effectively minimized in the HVS test circuit according to exemplary embodiment of the present inventions of the present invention.

The present invention should not be construed as being limited to the exemplary embodiments set forth herein. Rather, these exemplary embodiments are provided so that this disclosure will be thorough and complete and will fully convey the concept of the present invention to those skilled in the art.

Although the present invention has been particularly shown and described with reference to exemplary embodiments thereof, it will be understood by those of ordinary skill in the art that various changes in form and details may be made therein without departing from the scope or spirit of the present invention as defined by the following claims.

What is claimed is:

1. A high voltage stress test circuit comprising:
   an internal data generation unit for generating internal data and inverted internal data using a low supply voltage as a pull-up voltage; and
   a level shifter for receiving the internal data and the inverted internal data, and for generating digital data and inverted digital data in which a pull-up voltage is level-shifted to a high supply voltage, wherein
   in a normal mode, the internal data and the inverted internal data have logic states corresponding to input data,
   in a high voltage stress test mode, the internal data and the inverted internal data have predetermined logic states regardless of a logic state of the input data,
   in the normal mode, the digital data and the inverted digital data have logic states corresponding to the internal data and the inverted internal data, respectively, and
   in the high voltage stress test mode, the digital data and the inverted digital data have predetermined logic states regardless of logic states of the internal data and the inverted internal data.

2. A high voltage stress test circuit comprising:
   an internal data generation unit for generating internal data and inverted internal data using a low supply voltage as a pull-up voltage; and
   a level shifter for receiving the internal data and the inverted internal data and for generating digital data and inverted digital data in which a pull-up voltage is level-shifted to a high supply voltage, wherein
   in a normal mode, the internal data and the inverted internal data have logic states corresponding to input data,
   in a high voltage stress test mode, the internal data and the inverted internal data have a ground voltage regardless of a logic state of the input data,
   in the normal mode, the digital data and the inverted digital data have logic states corresponding to the internal data and the inverted internal data, respectively, and
   in the high voltage stress test mode, the digital data and the inverted digital data have one of the high supply voltage and the ground voltage regardless of logic states of the internal data and the inverted internal data.

3. The high voltage stress test circuit of claim 2, wherein the internal data generation unit comprises:
   an inverted internal data generation part for generating the inverted internal data by inverting the input data in the normal mode, and for controlling the inverted internal data to have the ground voltage in the HVS test mode; and
   an internal data generation part for generating the internal data by inverting the inverted internal data in the normal mode, and for controlling the internal data to have the ground voltage in the HVS test mode.

4. The high voltage stress test circuit of claim 3, wherein:
   the inverted internal data generation part comprises a first tri-state inverter for generating the inverted internal data by inverting the input data in the normal mode, and a first transistor for controlling the inverted internal data to have the ground voltage in the HVS test mode; and
   the internal data generation part comprises a second tri-state inverter for generating the internal data by inverting the inverted internal data in the normal mode, and a second transistor for controlling the internal data to have the ground voltage in the HVS test mode.

5. The high voltage stress test circuit of claim 2, wherein the level shifter comprises:

a power terminal through which the high supply voltage is applied;
a ground terminal through which the ground voltage is applied;
an output terminal for outputting the digital data;
an inverted output terminal for providing the inverted digital data;
an output pull-up unit disposed between the power terminal and the output terminal, the output pull-up unit configured to pull up the digital data to the high supply voltage in response to a pulling up of the inverted digital data in the normal mode, and configured to pull up the digital data regardless of a logic state of the inverted digital data in the high voltage stress test mode;
an inverted output pull-up unit disposed between the power terminal and the inverted output terminal, the inverted output pull-up unit configured to pull up the inverted digital data to the high supply voltage in response to a pulling down of the digital data in the normal mode, and configured to pull up the inverted digital data regardless of a logic state of the digital data in the high voltage stress test mode;
an output pull-down unit disposed between the ground terminal and the output terminal, the output pull-down unit configured to pull down the digital data to the ground voltage in response to a pulling up of the inverted input data; and
an inverted output pull-down unit disposed between the ground terminal and the inverted output terminal, the inverted output pull-down unit configured to pull down the inverted digital data to the ground voltage in response to a pulling up of the input data.

6. The high voltage stress test circuit of claim 5, wherein the output pull-up unit comprises:
a first PMOS transistor disposed between the power terminal and the output terminal, and configured to be gated by the inverted digital data;
a second PMOS transistor disposed between the power terminal and the output terminal and in electrical series with the first PMOS transistor, and configured to be turned off in response to a test mode signal activated in the HVS test mode; and
a third PMOS transistor disposed between the power terminal and the output terminal and in electrical parallel with the first PMOS transistor and the second PMOS transistor, and configured to be turned on in response to activation of the test mode signal and to pull up the digital data to the high supply voltage, and the inverted output pull-up unit comprises:
a fourth PMOS transistor disposed between the power terminal and the inverted output terminal and configured to be gated by the digital data;
a fifth PMOS transistor disposed between the power terminal and the inverted output terminal and in electrical series with the fourth PMOS transistor, and configured to be turned off in response to the test mode signal; and
a sixth PMOS transistor disposed between the power terminal and the inverted output terminal and in electrical parallel with the fourth PMOS transistor and the fifth PMOS transistor, and configured to be turned on in response to activation of the test mode signal, and to pull up the inverted digital data to the high supply voltage.

7. The high voltage stress test circuit of claim 2, wherein the level shifter comprises:

a power terminal through which the high supply voltage is applied;
a ground terminal through which the ground voltage is applied;
an output terminal for outputting the digital data;
an inverted output terminal for providing the inverted digital data;
an output pull-up unit disposed between the power terminal and the output terminal, the output pull-up unit configured to pull up the digital data to the high supply voltage in response to a pulling up of the inverted digital data in the normal mode, and configured to electrically disconnect a connection between the output terminal and the power terminal regardless of a logic state of the inverted digital data in the HVS test mode;
an inverted output pull-up unit disposed between the power terminal and the inverted output terminal, the inverted output pull-up unit configured to pull up the inverted digital data to the high supply voltage in response to a pulling down of the digital data in the normal mode, and configured to electrically disconnect a connection between the inverted output terminal and the power terminal regardless of a logic state of the digital data in the HVS test mode;
an output pull-down unit disposed between the ground terminal and the output terminal, the output pull-down unit configured to pull down the digital data to the ground voltage in response to a pulling up of the inverted internal data in the normal mode, and configured to pull down the digital data regardless of a logic state of the inverted internal data in the HVS test mode; and
an inverted output pull-down unit disposed between the ground terminal and the inverted output terminal, the inverted output pull-down configured to pull down the inverted digital data to the ground voltage in response to a pulling up of the internal data in the normal mode, and configured to pull down the inverted digital data regardless of a logic state of the internal data in the HVS test mode.

8. The high voltage stress test circuit of claim 7, wherein the output pull-up unit comprises:
a first PMOS transistor disposed between the power terminal and the output terminal, and configured to be gated by the inverted digital data; and
a second PMOS transistor disposed between the power terminal and the output terminal and in electrical series with the first PMOS transistor, and configured to be turned off in response to a test mode signal activated in the HVS test mode;
the inverted output pull-up unit comprises:
a third PMOS transistor disposed between the power terminal and the inverted output terminal, and configured to be gated by the digital data; and
a fourth PMOS transistor disposed between the power terminal and the inverted output terminal and in electrical series with the third PMOS transistor, and configured to be turned off in response to the test mode signal;
the output pull-down unit comprises:
a first NMOS transistor disposed between the ground terminal and the output terminal, and configured to be gated by the inverted internal data; and
a second NMOS transistor disposed between the ground terminal and the output terminal and in electrical parallel with the first NMOS transistor, and configured to pull down the digital data to the ground voltage in response to test mode signal, and the inverted output pull-down unit comprises:
- a third NMOS transistor disposed between the ground terminal and the inverted output terminal, and configured to be gated by the internal data; and
- a fourth NMOS transistor disposed between the ground terminal and the inverted output terminal and in electrical parallel with the third NMOS transistor, and configured to pull down the inverted digital data to the ground voltage in response to the test mode signal.

9. The high voltage stress test circuit of claim 7, wherein the output pull-up unit comprises:
- a first PMOS transistor disposed between the power terminal and the output terminal, and configured to be gated by the inverted digital data; and
- a second PMOS transistor disposed between the power terminal and the output terminal and in electrical series with the first PMOS transistor, and configured to be turned off in response to a test mode signal activated in the HVS test mode, and the inverted output pull-up unit comprises:
- a third PMOS transistor disposed between the power terminal and the inverted output terminal, and configured to be gated by the digital data; and
- a fourth PMOS transistor disposed between the power terminal and the inverted output terminal an in electrical series with the third PMOS transistor, and configured to be turned off in response to the test mode signal.

10. A high voltage stress test circuit comprising:
- an internal data generation unit for generating internal data and inverted internal data using a low supply voltage as a pull-up voltage; and
- a level shifter for receiving the internal data and the inverted internal data and for generating digital data and inverted digital data in which a pull-up voltage is level-shifted to a high supply voltage, wherein
- in a normal mode, the internal data and the inverted internal data have logic states corresponding to input data, and the digital data and the inverted digital data have logic states corresponding to the internal data and the inverted internal data, and
- in a high voltage stress test mode, the internal data and the inverted internal data are controlled such that they have the low supply voltage regardless of a logic state of the input data, and the digital data and the inverted digital data have the ground voltage regardless of logic states of the internal data and the inverted internal data.

11. The high voltage stress test circuit of claim 10, wherein the internal data generation unit comprises:
- a first logical sum part which generates the internal data based on the input data in the normal mode, and which controls the internal data to have the low supply voltage in the high voltage stress test mode;
- an inverter for inverting an output of the first logical sum part; and
- a second logical sum part which generates the inverted internal data based on an output of the inverter in the normal mode, and which controls the internal data to have the low supply voltage in the high voltage stress test mode.

12. The high voltage stress test circuit of claim 10, wherein the level shifter comprises:
- a power terminal through which the high supply voltage is applied;
- a ground terminal through which the ground voltage is applied;
- an output terminal for outputting the digital data;
- an inverted output terminal for providing the inverted digital data;
- an output pull-up unit disposed between the power terminal and the output terminal, the output pull-up unit configured to pull up the digital data to the high supply voltage in response to a pulling up of the inverted digital data in the normal mode, and configured to electrically disconnect a connection between the output terminal and the power terminal regardless of a logic state of the inverted digital data in the high voltage stress test mode;
- an inverted output pull-up unit disposed between the power terminal and the output terminal, the inverted output pull-up unit configured to pull up the inverted digital data to the high supply voltage in response to a pulling down of the digital data in the normal mode, and configured to electrically disconnect a connection between the inverted output terminal and the power terminal regardless of a logic state of the digital data in the high voltage stress test mode;
- an output pull-down unit disposed between the ground terminal and the output terminal, the output pull-down unit configured to pull down the digital data to the ground voltage in response to a pulling up of the inverted input data; and
- an inverted output pull-down unit disposed between the ground terminal and the inverted output terminal, the inverted output pull-down unit configured to pull down the inverted digital data to the ground voltage in response to a pulling up of the input data.

* * * * *